(12) United States Patent
Razzell (10) Patent No.: US 10,777,851 B2
(45) Date of Patent: Sep. 15, 2020

(54) MULTIPOINT COMMUNICATION SYSTEMS FOR BATTERY MANAGEMENT SYSTEMS, AND ASSOCIATED SYSTEMS AND METHODS

(71) Applicant: Maxim Integrated Products, Inc., San Jose, CA (US)

(72) Inventor: Charles J. Razzell, Pleasanton, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 30 days.

(21) Appl. No.: 16/276,392

(22) Filed: Feb. 14, 2019

(65) Prior Publication Data

US 2019/0252734 A1    Aug. 15, 2019

Related U.S. Application Data

(60) Provisional application No. 62/630,950, filed on Feb. 15, 2018.

(51) Int. Cl.
*H01M 4/02* (2006.01)
*H01M 10/42* (2006.01)
*H01M 10/44* (2006.01)
*G01R 31/36* (2020.01)

(52) U.S. Cl.
CPC ...... *H01M 10/425* (2013.01); *G01R 31/3644* (2013.01); *H01M 10/441* (2013.01); *H01M 2010/4271* (2013.01); *H01M 2010/4278* (2013.01)

(58) Field of Classification Search
CPC ...................................................... H01M 4/02
See application file for complete search history.

(56) References Cited

U.S. PATENT DOCUMENTS

| | | | |
|---|---|---|---|
| 9,214,822 B2 | 12/2015 | Hartley et al. | |
| 2010/0073003 A1 | 3/2010 | Sakurai et al. | |
| 2014/0354291 A1 | 12/2014 | Kikuchi et al. | |
| 2018/0114389 A1* | 4/2018 | Geiszler | H02J 7/025 |

* cited by examiner

*Primary Examiner* — Jacob B Marks
(74) *Attorney, Agent, or Firm* — Lathrop GPM LLP (57) ABSTRACT

A multipoint communication system for a battery management system includes a distributed antenna at least partially disposed within a battery pack, a plurality of nodes, each node being wirelessly coupled to the distributed antenna and configured to acquire battery information, and a radio frequency gateway electrically coupled to the distributed antenna.

20 Claims, 11 Drawing Sheets

| Preamble | Access Address | Data Protocol Unit (PDU) | | | CRC |
|---|---|---|---|---|---|
| | | Header | Payload | MIC | |
| 1 byte | 4 bytes | 2 bytes | Up to 251 bytes | 4 bytes | 3 bytes |

MULTIPOINT COMMUNICATION SYSTEMS FOR BATTERY MANAGEMENT SYSTEMS, AND ASSOCIATED SYSTEMS AND METHODS

RELATED APPLICATIONS

This Application claims benefit of priority to U.S. Provisional Patent Application Ser. No. 62/630,950, filed Feb. 15, 2018, which is incorporated herein by reference.

BACKGROUND

Battery managements systems are commonly used to control battery operation in a wide range of applications, such as in electrical vehicle applications and in renewable energy storage applications. For example, battery management systems may be used to control charging and discharging of multiple battery modules in a battery pack, such as to maximize energy storage and/or to prolong battery module life. As another example, battery management systems may be used to monitor battery modules for abnormal operation and shut-down and/or bypass a battery module in response thereto.

DETAILED DESCRIPTION OF THE EMBODIMENTS

Conventional battery management systems include a node at each battery module, where the node is configured to control and/or monitor battery cells of the battery module. The nodes are typically communicatively coupled to a controller via communication cables, to enable communication between the controller and the nodes. The controller, for example, sends charging/discharging commands to the nodes, and each node controls charging and discharging of its respective battery module according to the commands. Each node may also send battery information, including but not limited to battery voltage, battery temperature, and/or battery current, to the controller, and the controller may use the battery information to generate charging/discharging commands.

Such conventional battery management systems may work well in applications where there are a relatively small number of battery modules. However, Applicant has found that conventional battery management systems do not easily scale to applications with a large number of battery modules, especially where the battery modules are densely packed in a battery pack chassis. For example, a conventional battery management system used with a large number of battery modules will require a large number of communication cables, i.e., at least one communication cable physically coupled to each battery module. It may be difficult or even impossible to route this large number of communication cables within a battery pack chassis due to space constraints within the battery pack. Additionally, the large number of communication cables may be relatively susceptible to failure and/or electromagnetic interference (EMI), thereby impairing battery management system reliability.

Accordingly, Applicant has developed multipoint communication systems for battery management systems that at least partially overcome one or more of the drawbacks discussed above. The multipoint communication systems include a plurality of nodes, at least one distributed antenna, and a radio frequency (RF) gateway coupled to the distributed antenna. A controller, for example, is communicatively coupled to the RF gateway. Each node is wirelessly coupled to the distributed antenna, such that the nodes communicate with the controller via the distributed antenna and the RF gateway. In some embodiments, each node is physically disposed close to the distributed antenna, such as within several centimeters of the distributed antenna, to help minimize wireless communication distance. In certain embodiments, each node controls a respective battery module in accordance with commands received from the controller via the distributed antenna, and in some embodiments, each node sends battery information, including but not limited to battery voltage, battery temperature, battery current, and/or battery module identifying information, to the controller via the distributed antenna. The controller in these embodiments optionally uses the battery information to control the energy storage system.

The distributed antenna and the RF gateway each serve as a shared communication medium, i.e., they are shared by all of the nodes, in the new multipoint communication systems. Consequently, it is not necessary to physically couple each node to a communication cable, thereby potentially greatly reducing number of required communication cables relative to conventional systems. Additionally, use of the distributed antenna in the communicating path between the RF gateway and the nodes achieves significant advantages relative to fully-wireless or fully-wired communication systems. For example, use of the distributed antenna contains communication signals along a portion of the communication path, while still achieving wireless communication at the nodes. Such containment of the communication signals promotes reliable communication by shielding the communication signals from interference, while promoting electromagnetic compatibility (EMC) by helping prevent egress of the communication signals to other systems. Wireless communication at the nodes, in turn, eliminates the need for communication cables to physical couple to the nodes, thereby promoting reliability, low system cost, and electrical isolation between the nodes and the RF gateway. Moreover, use of the distributed antenna, instead of a fully-wireless communication system, helps ensure a good communication channel to each node, which is particularly advantageous in applications that are not conducive to fully-wireless communication, such as in battery packs including objects which impede wireless signal transmission.

Figure 1:
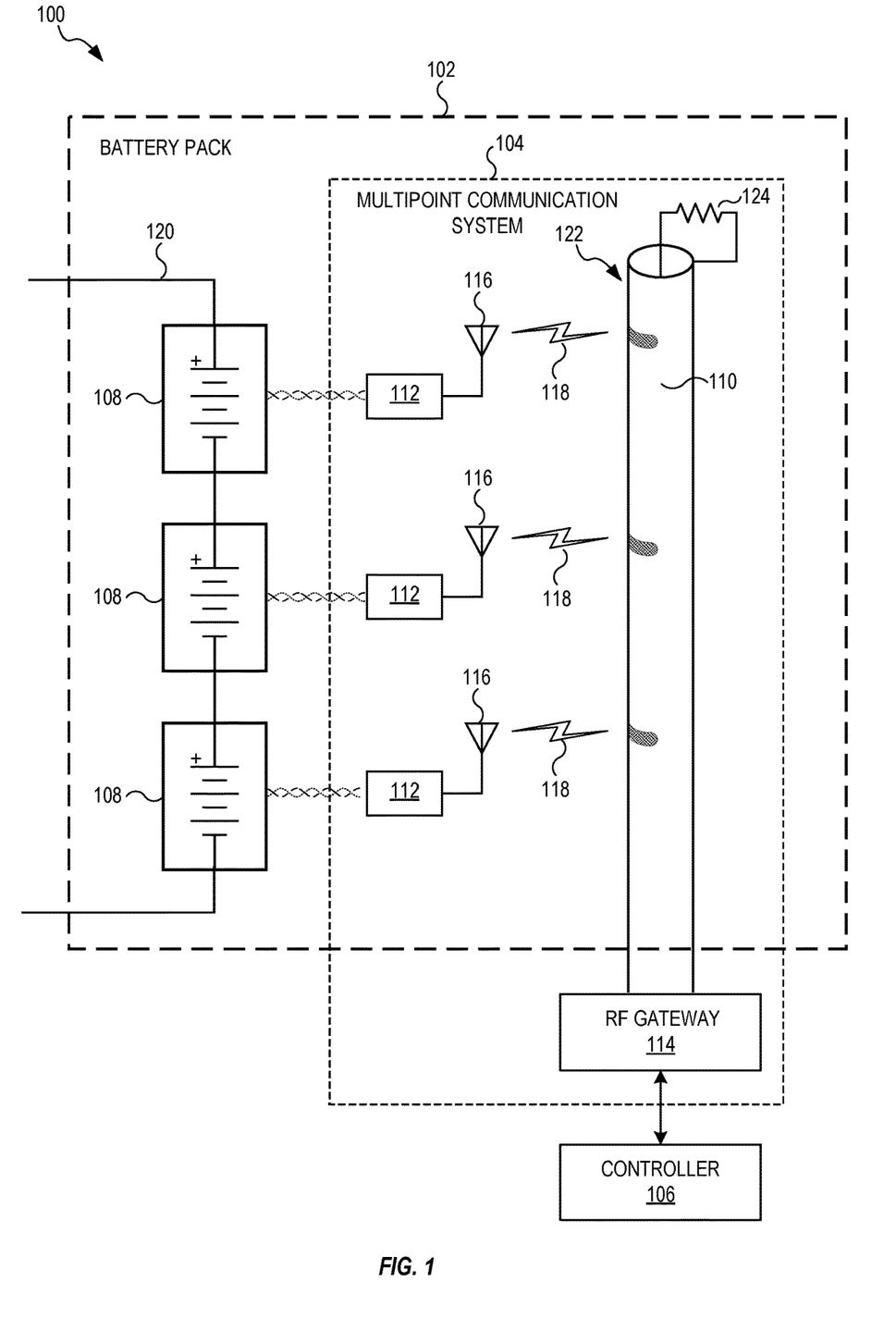
FIG. 1 illustrates an energy storage system including a multipoint communication system, according to an embodiment.

FIG. 1 illustrates an energy storage system 100 including a battery pack 102, a multipoint communication system 104, and a controller 106. Possible applications of energy storage system 100 include, but are not limited to, electric vehicle applications and renewable energy storage applications. Battery pack 102 includes one or more battery modules 108. Each battery module 108 includes one or more battery cells (not shown) capable of storing energy in chemical form. The battery cells are, for example, electrically coupled in series and/or parallel. Battery modules 108 may include additional elements (not shown) without departing from the scope hereof. For example, in some embodiments, each battery module 108 includes one or more sensors for obtaining battery information, including but not limited to battery temperature, battery voltage, battery current, and/or battery power. As another example, in some embodiments, each battery module 108 includes one or more switching devices configured to disconnect constituent battery cells of the battery module from external electrical circuitry. The number of battery modules 108 in battery pack 102 may be varied without departing from the scope hereof.

Multipoint communication system 104 and controller 106 collectively form at least part of a battery management system. Multipoint communication system 104, which is an embodiment of the new multipoint communication systems developed by Applicant, communicatively couples controller 106 to battery modules 108. Multipoint communication system 104 includes a distributed antenna 110, a respective node 112 for each battery module 108, and an RF gateway 114. RF gateway 114 is electrically coupled to distributed antenna 110, and distributed antenna 110 is at least partially disposed in battery pack 102 and routed proximate to nodes 112. In certain embodiments, such as in embodiments where distributed antenna 110 is a coaxial cable, an end 122 of distributed antenna 110 is terminated with an impedance matching device 124. Impedance matching device 124 includes, for example, a resistive device. Each node 112 is electrically coupled to its respective battery module 108, and each node 112 includes an antenna 116 configured to wirelessly communicate 118 with distributed antenna 110. Each node 112 is configured to (a) send signals to distributed antenna 110 via wireless communication 118 and/or (b) receive signals from distributed antenna 110 via wireless communication 118. In certain embodiments, each node 112 is physically disposed close to distributed antenna 110, such as within several centimeters of distributed antenna 110, to help minimize wireless communication 118 distance between nodes 112 and distributed antenna 110. Although nodes 112 are illustrated as being separate from battery modules 108, nodes 112 could be co-packaged with battery modules 108 without departing from the scope hereof.

In certain embodiments, multipoint communication system 104 is configured for two-way communication between nodes 112 and controller 106. For example, in particular embodiments, each node 112 is configured to transmit a first wireless communication 118 containing respective battery information, such as information representing one or more operating parameters of its respective battery module 108, operating parameters of one or more cells (not shown) of battery module 108, and/or battery module 108 identifying information, to distributed antenna 110. Examples of battery module 108 and battery cell operating parameters include, but are not limited to, voltage, current, power, and/or temperature information. Examples of battery module 108 identifying information include, but are not limited to, make of battery module 108, model of battery module 108, serial number of battery module 108, number of battery cells within battery module 108, and/or type of battery cells within battery module 108. Distributed antenna 110 is configured to convert the first wireless communication 118 into a first electrical communication which is received by RF gateway 114. Controller 106 receives the first electrical communication from RF gateway 114. Thus, multipoint communication system 104 is configured to transmit battery information from nodes 112 to controller 106. In certain embodiments, controller 106 controls operation of energy storage system 100 at least partially based on the battery information received via multipoint communication system 104.

In these embodiments, RF gateway 114 is further configured to receive a second electrical communication, such as a command for one or more nodes 112, from controller 106. RF gateway 114 is configured to electrically transmit the second electrical communication to distributed antenna 110, and distributed antenna 110 is configured to convert the second electrical communication into a second wireless communication. Each node 112 is configured to receive the second wireless communication from distributed antenna 110. Thus, multipoint communication system 104 is also configured to transmit information from controller 106 to nodes 112, in these embodiments. Examples of commands being transmitted from controller 106 to nodes 112 include, but are not limited, a command for one or more node 112 to transmit battery information to controller 106 and/or a command for one or more nodes 112 to cause their respective battery modules 108 to be disconnected from energy storage system 100.

In some alternate embodiments, multipoint communication system 104 is configured for only one-way communication. For example, in some alternate embodiments, multipoint communication system 104 is configured to transmit information only from nodes 112 to controller 106, and in some other alternate embodiments, multipoint communication system 104 is configured to transmit information only from controller 106 to nodes 112.

In certain embodiments, controller 106 is configured to control charging and/or discharging of battery cells within battery modules 108 by controlling operation of one or more power converters electrically coupled to battery modules 108. Controller 106 controls operation of the one or more power converters, for example, at least partially based on battery information received from nodes 112 via multipoint communication system 104. For instance, in some embodiments, controller 106 controls charging and/or discharging of battery cells within battery modules 108 using one or more of voltage, current, power, temperature, and/or battery identification information, received from nodes 112 via multipoint communication system 104. In some embodiments, controller 106 controls charging and discharging of the battery cells to achieve an objective including but not limited to (a) long battery cell life, (b) fast battery cell charging, and/or (c) safe battery cell operation.

In particular embodiments, controller 106 is configured to determine one or more properties of battery modules 108 at least partially based on battery information received from nodes 112 via multipoint communication system 104. For example, in some embodiments, controller 106 is configured to determine battery module 108 state of charge, battery module 108 state of health, and/or remaining run time of energy storage system 100, at least partially based on one or more of voltage, current, power, temperature, and battery identification information, received from nodes 112 via multipoint communication system 104.

Additionally, in some embodiments, controller 106 is configured to perform one or more safety functions at least partially based on battery information received from nodes 112 via multipoint communication system 104. For instance, in some embodiments, controller 106 is configured detect an abnormal condition within one or more battery modules 108 at least partially based on one or more of voltage, current, power, temperature, and/or battery identification information, received from nodes 112 via multipoint communication system 104. Examples of abnormal conditions include, but are not limited to, excessive battery cell charge, excessive battery cell discharge, abnormal battery cell temperature, abnormal battery module 108 temperature, abnormal battery cell load, abnormal battery module 108 load, presence of a defective battery cell, presence of a defective battery module 108, and/or indication of tampering with battery module 108. In these embodiments, controller 106 is optionally configured to take action in response to detection of an abnormal event, such as shutting down energy storage system 100, transmitting a shut-down command to nodes 112 via multipoint communication system 104, and/or transmitting an abnormal event indication signal to an external system.

In certain embodiments, distributed antenna 110 includes a coaxial cable and/or a waveguide. In particular embodiments, distributed antenna 100 is a single-piece element, such as to promote reliability and/or low cost, while in some other embodiments, distributed antenna 110 is formed of two or more elements joined together, such as to facilitate disassembly of energy storage system 100. In some embodiments, distributed antenna 110 is flexible to facilitate routing distributed antenna 110 through battery pack 102, and distributed antenna 110 is optionally physically routed proximate to a wiring harness 120 of battery pack 102 to facilitate ease of manufacture of energy storage system 100.

Figure 2:
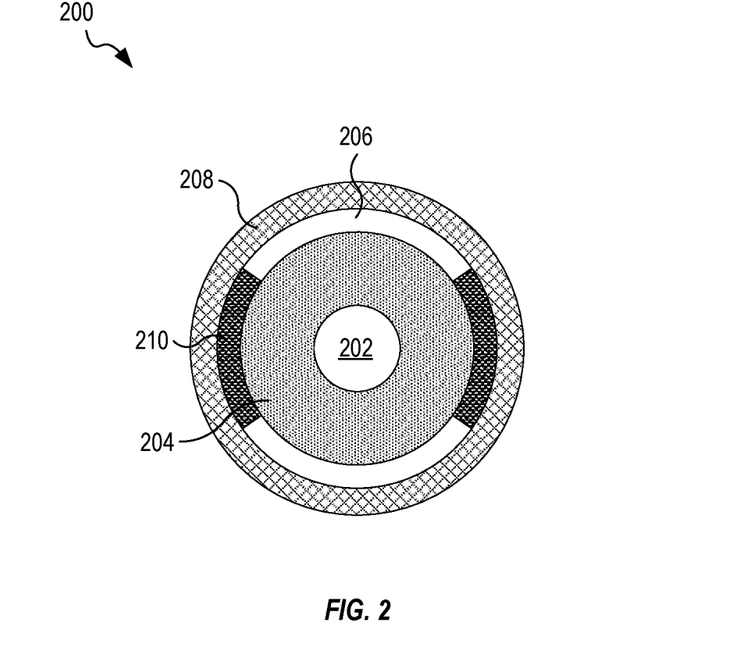
FIG. 2 is a cross-sectional view of a distributed antenna embodied as a coaxial cable, according to an embodiment.
Figure 3:
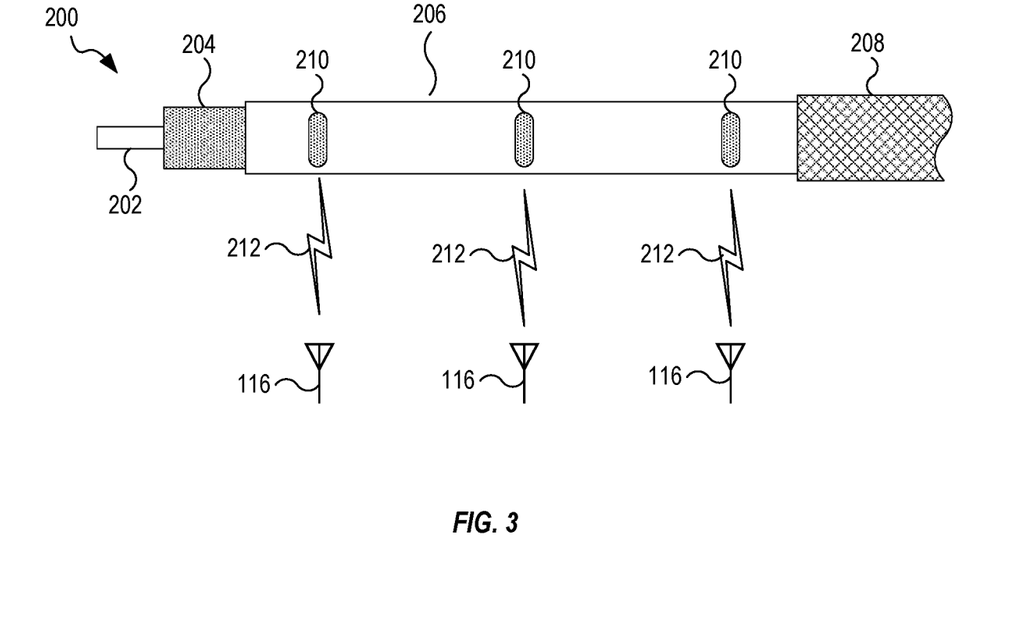
FIG. 3 is a cutaway side elevational view of the FIG. 2 distributed antenna.

FIGS. 2 and 3 illustrate a distributed antenna 200, which is one possible embodiment of distributed antenna 110 embodied as a coaxial cable. FIG. 2 is a cross-sectional view of distributed antenna 200, and FIG. 3 is a cutaway side elevational view of distributed antenna 200. Distributed antenna 200 includes a center conductor 202, an inner insulating layer 204, an outer conductor 206, and an outer insulating layer 208. Inner insulating layer 204 is disposed over center conductor 202, outer conductor 206 is disposed over inner insulating layer 204, and outer insulating layer 208 is disposed over outer conductor 206. Outer conductor 206 forms a plurality of gaps 210 to provide paths for wireless transmission 212 between antennas 116 and distributed antenna 200. In certain embodiment, each antenna 116 is disposed proximate to a gap 210 instance to minimize wireless transmission 212 distance. The number, size, and shape of apertures gaps 210 may vary without departing from the scope hereof.

Figure 4:
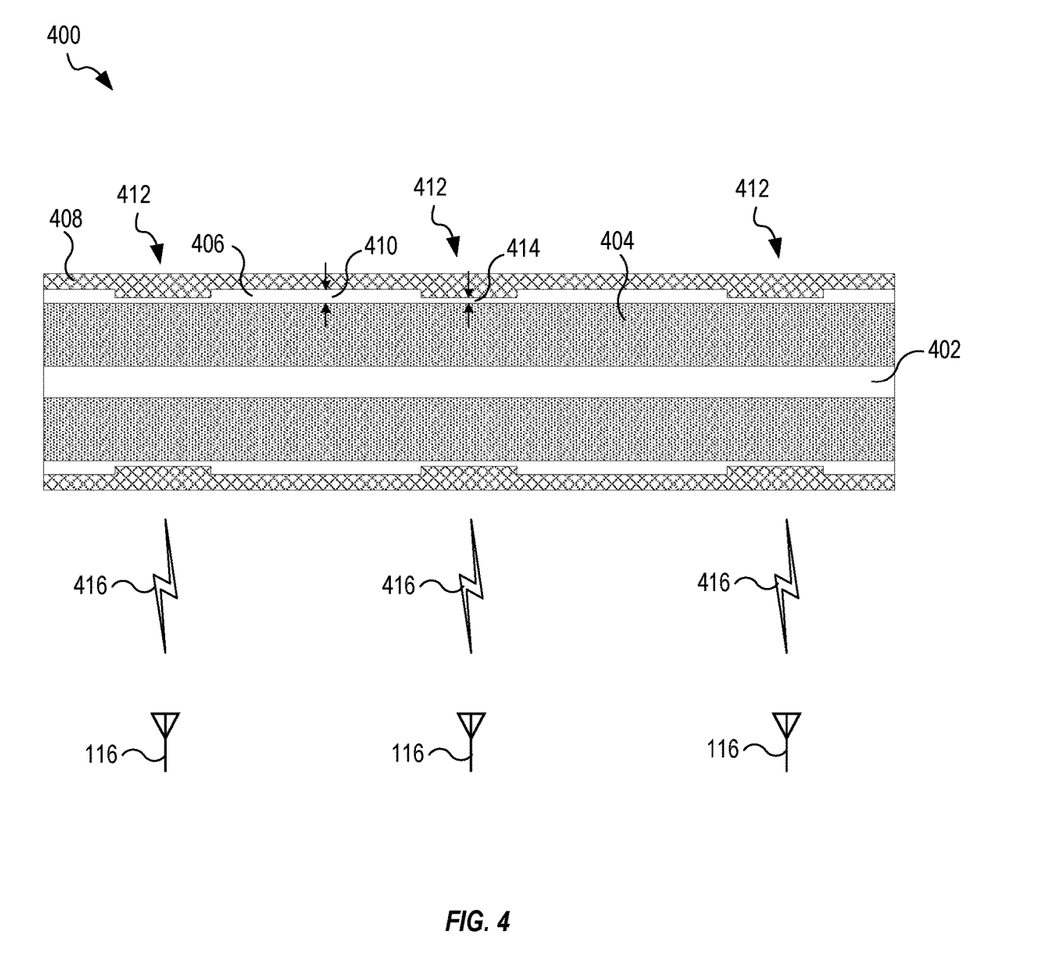
FIG. 4 is a cutaway side elevational view of another distributed antenna embodied as a coaxial cable, according to an embodiment.

FIG. 4 is a cross-sectional view illustrating a distributed antenna 400, which is another possible embodiment of distributed antenna 110 embodied as a coaxial cable. Distributed antenna 400 includes a center conductor 402, an inner insulating layer 404, an outer conductor 406, and an outer insulating layer 408. Inner insulating layer 404 is disposed over center conductor 402, outer conductor 406 is disposed over inner insulating layer 404, and outer insulating layer 408 is disposed over outer conductor 406. Outer conductor 406 has a nominal thickness 410, and outer conductor 406 has a plurality of thinned regions 412 having a thickness 414 that is less than nominal thickness 410. Thickness 414 is, for example, less than a skin depth of material forming outer conductor 406 at a design frequency of radiating transmission line 400. Thinned regions 412 provide paths for wireless transmission 416 between antennas 116 and distributed antenna 400. In certain embodiment, each antenna 116 is disposed proximate to a thinned region 412 instance to minimize wireless transmission 416 distance. The number, size, and shape of thinned regions 412 may vary without departing from the scope hereof.

Figure 5:
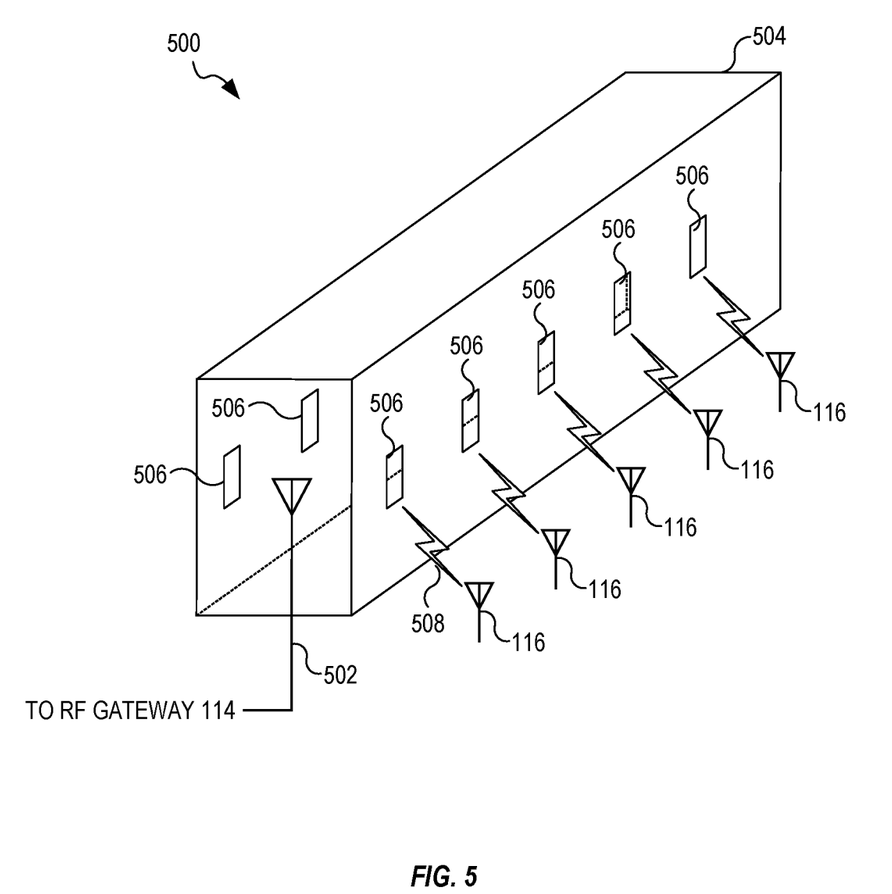
FIG. 5 is a perspective view of a distributed antenna including a waveguide, according to an embodiment.

FIG. 5 illustrates a distributed antenna 500, which is one possible embodiment of distributed antenna 110 including a waveguide. Distributed antenna 500 includes a base station antenna 502 and a waveguide 504. Waveguide 504 is formed of a plurality of conductive surfaces and is configured to guide wireless signals between base station antenna 502 and antennas 116. Base station antenna 502 is electrically coupled to RF gateway 114 and is configured to excite waveguide 504 and thereby generate wireless signals in response to electrical signals from controller 106. Base station antenna 502 is further configured to generate electrical signals in response to receiving transmissions, such as wireless signals from antennas 116. In some embodiments, base station antenna 502 is a coaxial feeder or a short dipole. In certain embodiments, such as illustrated in FIG. 5, waveguide 504 is a slotted wave guide antenna forming one or more apertures 506 to displace current flowing through waveguide 502, thereby promoting radiation from waveguide 504 and resulting wireless transmission 508 between antennas 116 and waveguide 504. The number, size, and shape of apertures 506 may vary without departing from the scope hereof. Additionally, although waveguide 504 is illustrated as having a rectangular cross-section, waveguide 504 could alternately have cross-section of a different shape, such as a circular shape.

In certain embodiments, waveguide 504 is at least partially formed of one or more electrically conductive surfaces forming a part of battery pack 102. In these embodiments, waveguide 504 is optionally loaded with an insulator (not shown) having a moderate or high dielectric constant to reduce a portion of waveguide 504's cross-section dedicated to wireless signal transmission, while also contributing to battery pack 102's mechanical stability.

Figure 6:
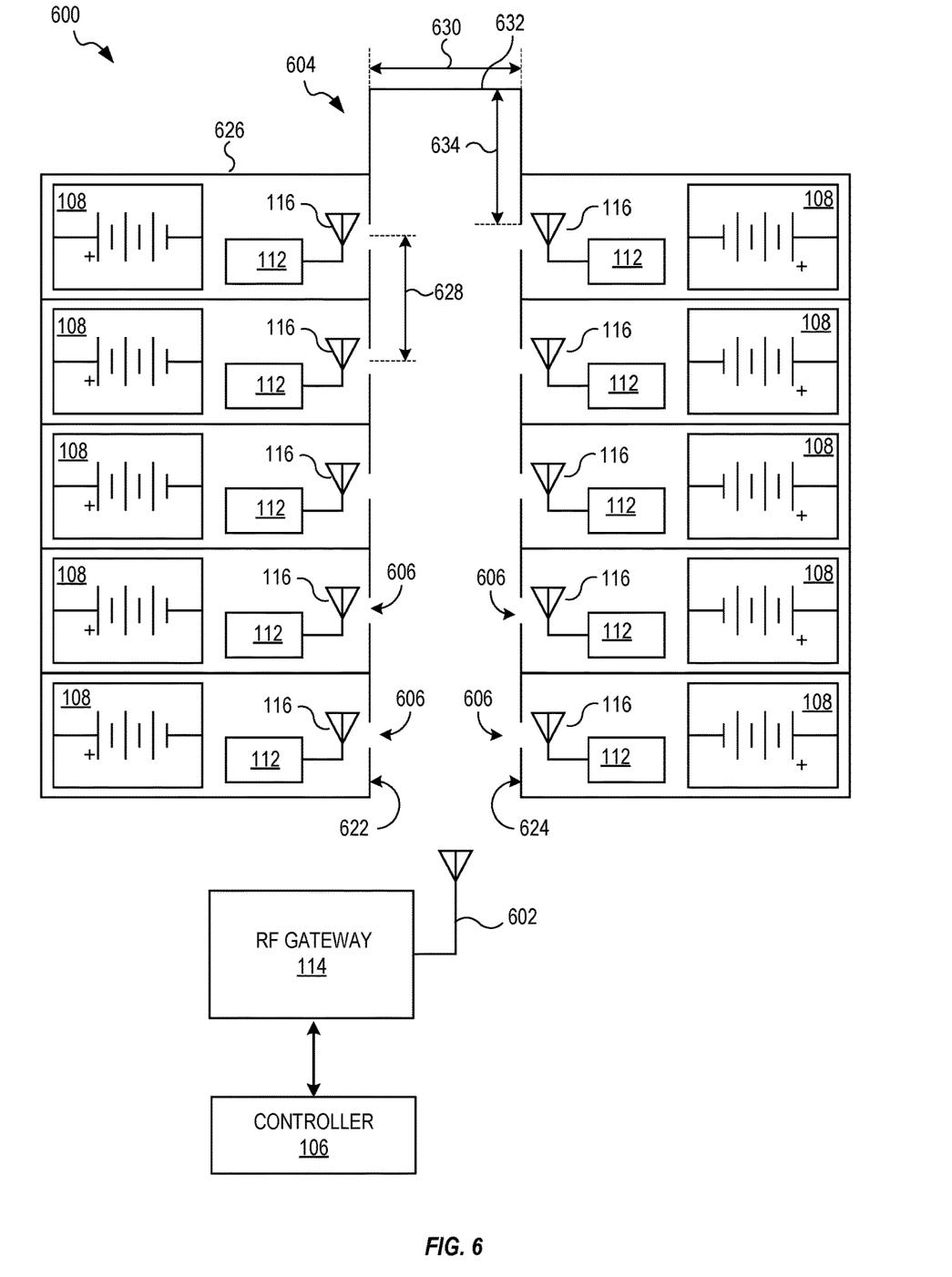
FIG. 6 illustrates an embodiment of the FIG. 1 energy storage system where a distributed antenna includes a waveguide.

FIG. 6 illustrates an energy storage system 600, which is an embodiment of energy storage system 100 where distributed antenna 110 is embodied by a base station antenna 602 and a waveguide 604. Base station antenna 602 and waveguide 604 are embodiments of base station antenna 502 and waveguide 504, respectively. Waveguide 604 is partially formed of electrically conductive surfaces 622 and 624 of a battery pack 626, which is an embodiment of battery pack 102. Waveguide 604 is optionally loaded with an insulator (not shown) having a moderate or high dielectric constant to reduce a portion of waveguide 604's cross-section dedicated to wireless signal transmission, while also contributing to battery pack 626 mechanical stability Waveguide 604 forms a plurality of apertures 606, and each antenna 116 is disposed proximate to an aperture 606 instance to minimize wireless transmission distance. Only some instances of apertures 606 are labeled to promote illustrative clarity. Pitch 628 of apertures 606 is, for example, one half of wavelength at an intended operating frequency of waveguide 604, or an odd multiple thereof. Waveguide 604 further includes a metallic end piece 632 configured to electrically short conductive surfaces 622 and 624. End piece 632 is disposed a distance 634 from last apertures 606. Distance 634 is, for example, one quarter of wavelength at an intended operating frequency of waveguide 604, or an odd multiple thereof. A transverse width 630 between electrically conductive surfaces 622 and 624 is selected, for example, to achieve a desired cutoff frequency of waveguide 604.

Figure 7:
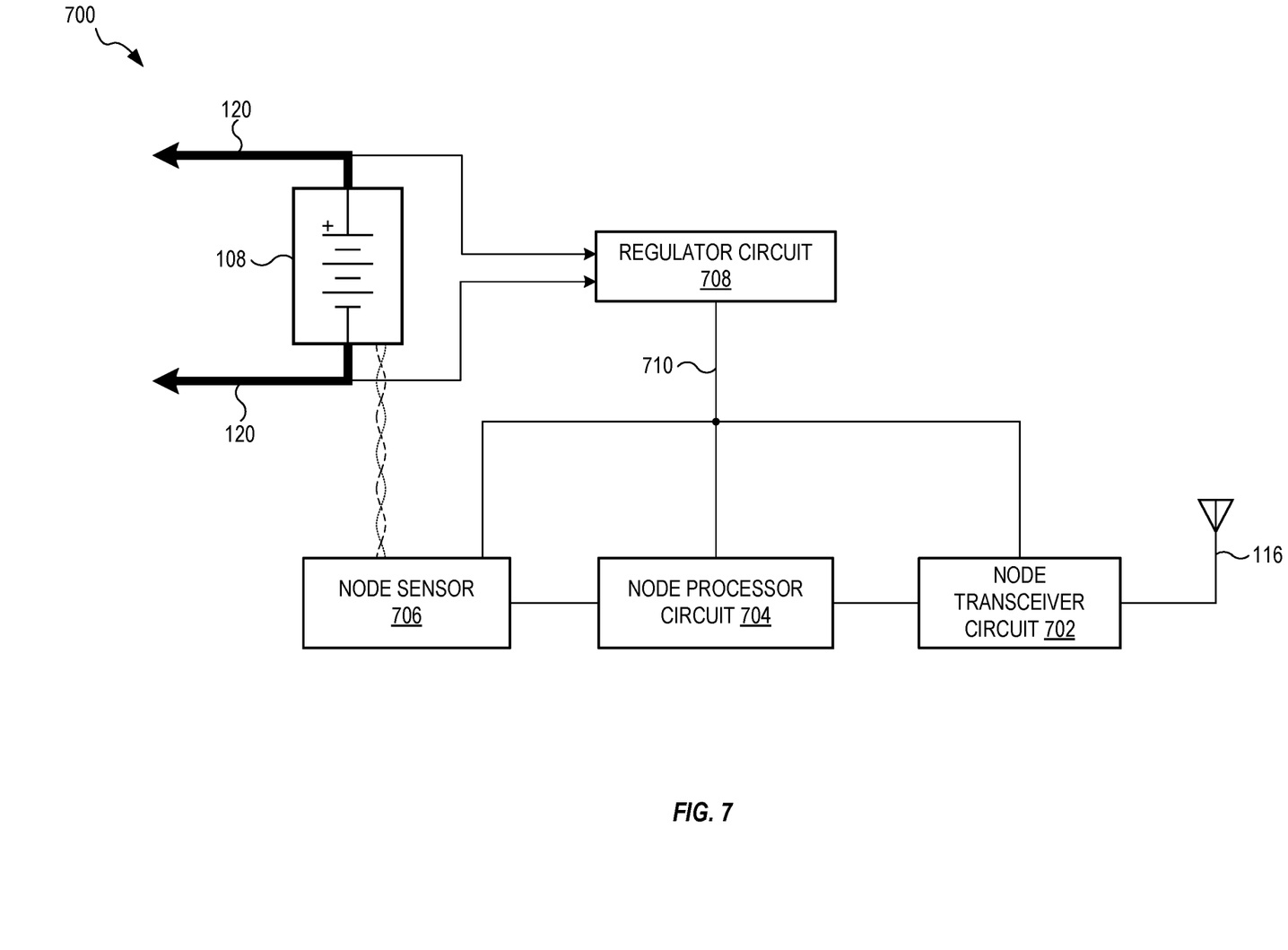
FIG. 7 illustrates one embodiment of a node of the FIG. 1 multipoint communication system.

FIG. 7 illustrates a node 700, which is one embodiment of node 112. Node 700 includes antenna 116, a node transceiver circuit 702, a node processor circuit 704, a node sensor 706, and a node regulator circuit 708. Antenna 116 is configured to convert electrical signals received from node transceiver circuit 702 to wireless signals for transmission to distributed antenna 110, and antenna 116 is further configured to convert wireless signals received from distributed antenna 110 to electrical signals for transmission to node transceiver circuit 702. Node transceiver circuit 702 is electrically coupled to each of antenna 116 and node processor circuit 704, and node transceiver circuit 702 is configured to interface antenna 116 with node processor circuit 704. Node regulator circuit 708 is electrically coupled to battery module 108, and node regulator circuit 708 is configured to power each of node transceiver circuit 702, node processor circuit 704, and node sensor 706 via a power buss 710. In some embodiments, node regulator circuit 708 includes a switching power converter and/or a linear regulator.

Node sensor 706 is communicatively coupled to battery module 108 and node processor circuit 704. Node sensor 706 is configured to send a sensor circuit output to node processor circuit 704, where the sensor circuit output indicates one or more properties of battery module 108. For example, in some embodiments, the sensor circuit output indicates one or more of temperature of battery module 108, voltage of battery module 108, current through battery module 108, charge or discharge power of battery module 108, and battery module 108 identifying information. In some embodiments, node sensor 706 cooperates with one or more devices within battery module 108, including but not limited to a temperature sensor, a current sensor, or other circuitry, systems, or sensors, within battery module 108, to generate the sensor circuit output. In some other embodiments, node sensor 706 determines the sensor circuit output solely using elements within node sensor 706.

Figure 8:
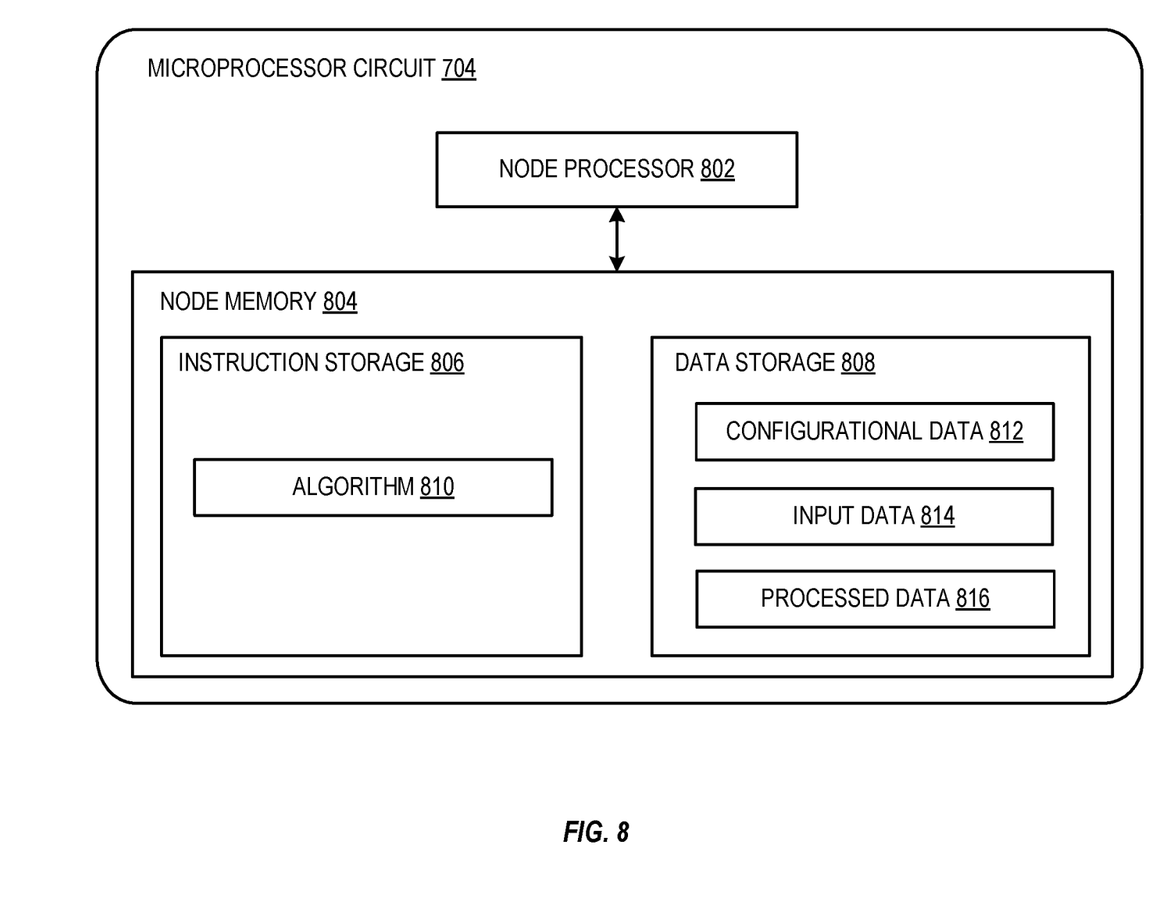
FIG. 8 illustrates a node processor circuit of the FIG. 7 node, according to an embodiment.

Node processor circuit 704 is communicatively coupled to each of node transceiver circuit 702 and node sensor 706. Node processor circuit 704 executes machine readable instructions to control node 700. For example, in some embodiments, node processor circuit 704 controls node sensor 706 to the generate sensor circuit output, and node processor circuit 704 controls node transceiver circuit 702 to transmit the sensor circuit output to antenna 116. FIG. 8 illustrates node processor circuit 704 in greater detail. Node processor circuit 704 includes a node processor 802 and a node memory 804 communicatively coupled to node processor 802. Node memory 804 includes instruction storage 806 and data storage 808. Instruction storage 806 includes an algorithm 810, and data storage 808 includes configurational data 812, input data 814, and processed data 816. Algorithm 810 specifies how microprocessor circuit 704 is to control node 700, and configurational data 812 includes parameters used in algorithm 810, such as characteristics of battery module 108. Input data 814 is data received by microprocessor circuit 704 for processing from one or more of node transceiver circuit 702 and node sensor 706. Processed data 816 is data processed by microprocessor circuit 704 for transmission to one or more of node transceiver circuit 702 and node sensor 706.

Figure 9:
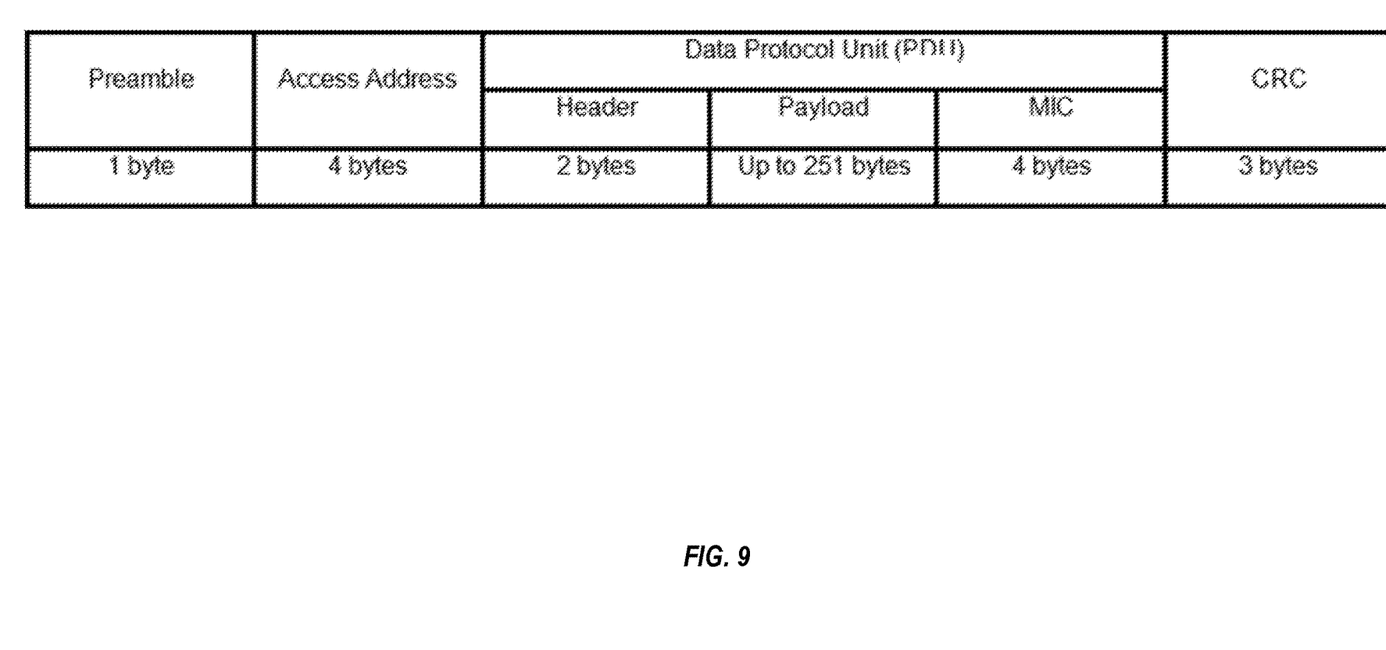
FIG. 9 illustrates one possible packet configuration in an embodiment of the FIG. 1 multipoint communication system based on a Bluetooth 4.2 Low Energy standard.

In certain embodiments, RF gateway 114 and nodes 112 are configured as a wireless personal area network. Examples of possible wireless personal area network protocols include, but are not limited to, Bluetooth Low Energy and ZigBee protocol. For example, in a particular embodiment, the wireless personal area network is based on Bluetooth Low Energy protocol and is configured to use a Battery Service profile. FIG. 9 illustrates one possible packet configuration in an embodiment based on a Bluetooth 4.2 Low Energy protocol. The packet includes a preamble, an access address, a data protocol unit (PDU), and a cyclic redundancy check (CRC). The PDU includes a payload of up to 251 bytes, in this embodiment.

Figure 10:
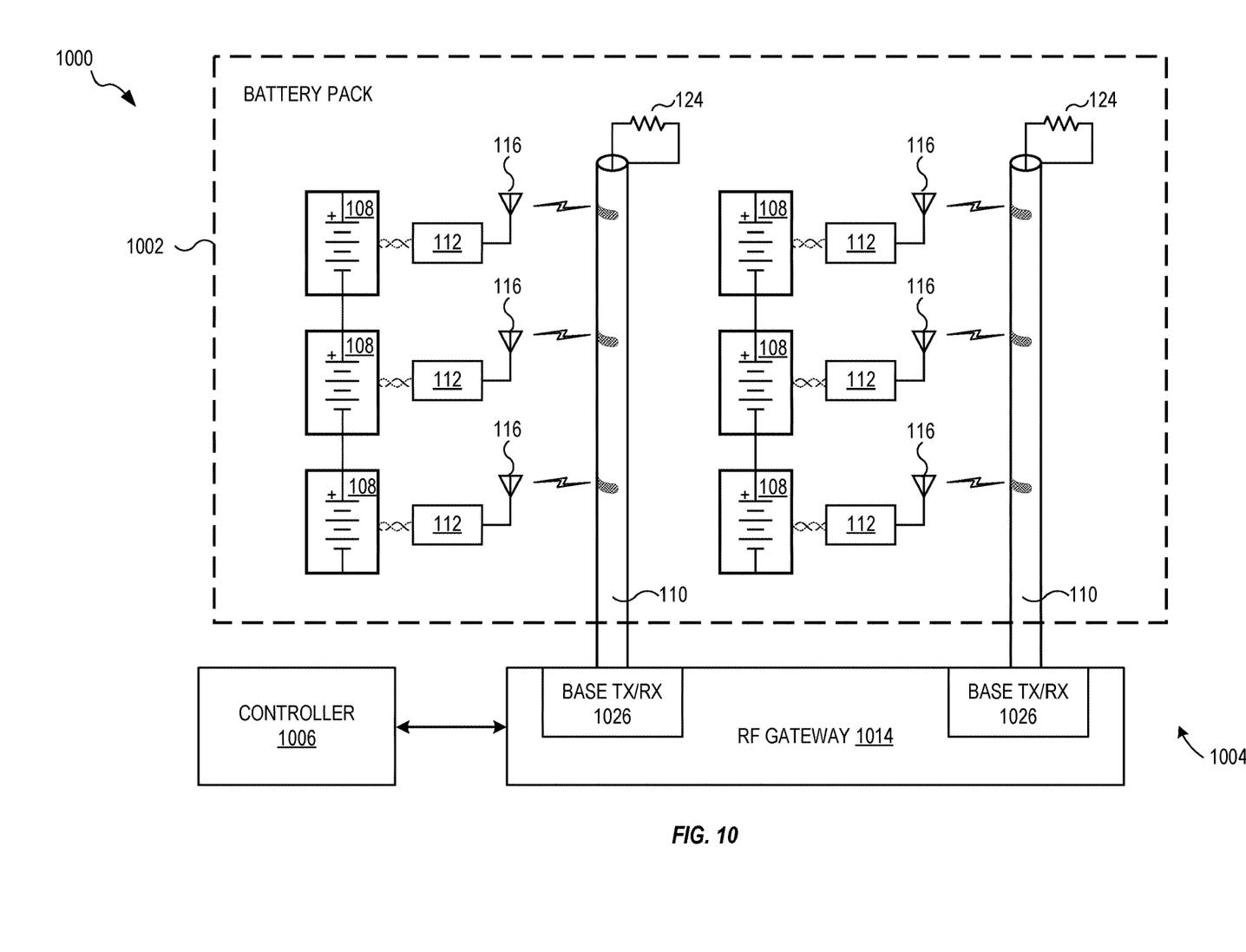
FIG. 10 illustrates an energy storage system including two distributed antenna instances, according to an embodiment.

Multipoint communication system 104 could include additional distributed antennas. For example, FIG. 10 illustrates an energy storage system 1000 including a battery pack 1002, a multipoint communication system 1004, and a controller 1006, which are embodiments of battery pack 102, multipoint communication system 104, and controller 106, respectively. Battery pack 1002 includes a plurality of battery modules 108. Multipoint communication system 1004 includes two instances of distributed antenna 110, a respective node 112 for each battery module 108, and an RF gateway 1014. RF gateway 1014 includes a respective base transceiver circuit 1026 electrically coupled to each distributed antenna 110 instance. Multipoint communication system 1004 operates in a manner similar to that of multipoint communication system 104 of FIG. 1.

Figure 11:
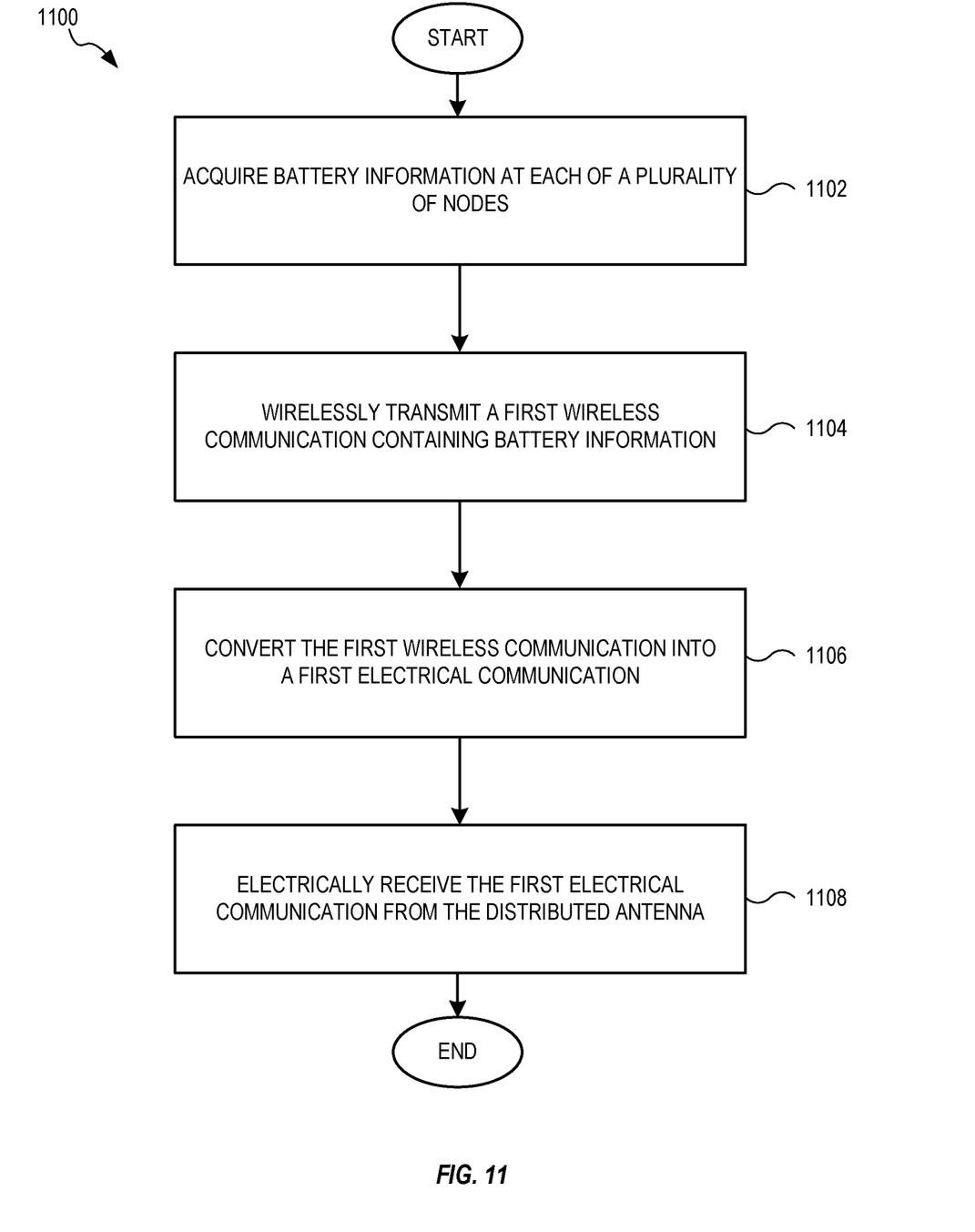
FIG. 11 illustrates a method for managing a battery pack, according to an embodiment.

FIG. 11 illustrates a method 1100 for managing a battery pack. In step 1102, battery information is acquired at each of a plurality of nodes. In one example of step 1102, node sensor 706 acquires battery information at each instance of node 700. In step 1104, a first wireless communication containing the battery information is transmitted at each of the plurality of nodes to the distributed antenna. In one example of step 1104, antenna 116 of each node 700 transmits the battery information via a first wireless communication 118 to distributed antenna 110. In step 1106, the first wireless communication is converted into a first electrical communication via the distributed antenna. In one example of step 1106, distributed antenna 110 converts the first wireless communication into a first electrical communication. In step 1108, the first electrical communication is received from the distributed antenna at an RF gateway. In one example of step 1108, the first electrical communication is received at RF gateway 114.

Figure 12:
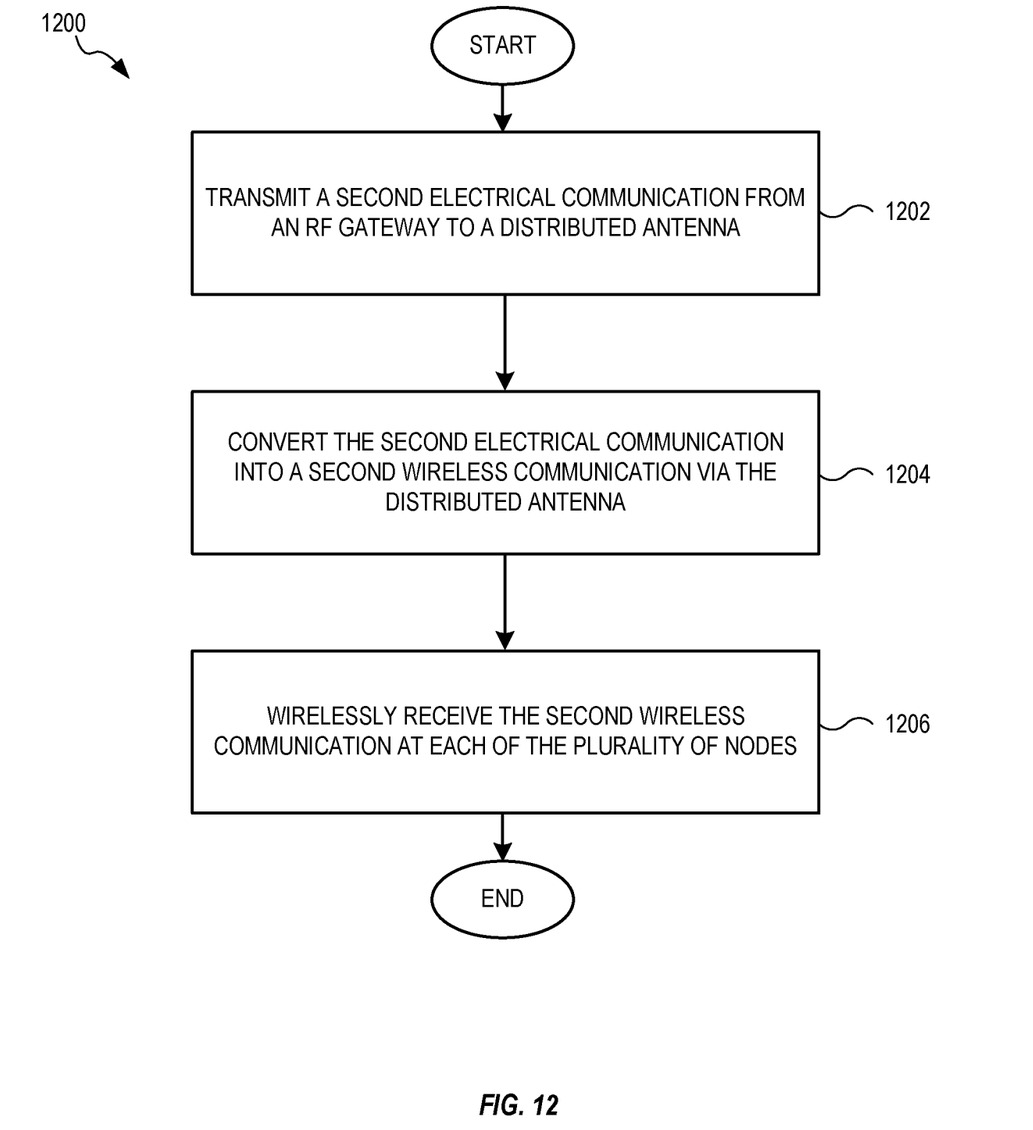
FIG. 12 illustrates another method for managing a battery pack, according to an embodiment.

FIG. 12 illustrates another method 1200 for managing a battery pack. In step 1202, a second electrical communication is electrically transmitted from an RF gateway to a distributed antenna. In one example of step 1202, a second electrical communication is transmitted from RF gateway 114 to distributed antenna 110. In step 1204, the second electrical communication is converted into a second wireless communication via the distributed antenna. In one example of step 1204, the second electrical communication is converted into a second wireless communication via distributed antenna 110. In step 1206, the second wireless communication is wirelessly received at each of the plurality of nodes. In one example of step 1206, the second wireless communication is wirelessly received at each node 700.

Combinations of Features

Features described above may be combined in various ways without departing from the scope hereof. The following examples illustrate some possible combinations:

(A1) A multipoint communication system for a battery management system may include (1) a distributed antenna at least partially disposed within a battery pack, (2) a plurality of nodes, each node wirelessly coupled to the distributed antenna and configured to acquire battery information, and (3) a radio frequency (RF) gateway electrically coupled to the distributed antenna.

(A2) In the multipoint communication system denoted as (A1), each of the plurality of nodes may be electrically coupled to a respective battery module of the battery pack.

(A3) In any one of the multipoint communication systems denoted as (A1) and (A2), each of the plurality of nodes may be configured to transmit a first wireless communication containing respective battery information to the distributed antenna, the distributed antenna may be configured to convert the first wireless communication into a first electrical communication, and the RF gateway may be configured to receive the first electrical communication.

(A4) In the multipoint communication system denoted as (A3), the RF gateway may be configured to electrically transmit a second electrical communication to the distributed antenna, the distributed antenna may be configured to convert the second electrical communication into a second wireless communication, and the plurality of nodes may be configured to receive the second wireless communication.

(A5) In the multipoint communication system denoted as (A4), each of the plurality of nodes may include a node transceiver circuit and a node processor circuit. The node processor circuit may include a node processor communicatively coupled to the node transceiver circuit and a node memory communicatively coupled to the node processor and storing machine-readable instructions that, when executed by the node processor, control the node to (i) receive the second wireless communication from the node transceiver circuit and (ii) control the node processor according to a content of the second wireless communication.

(A6) In the multipoint communication system denoted as (A5), each of the plurality of nodes may further include a node sensor circuit communicatively coupled to the node processor circuit and configured to send to the node processor circuit a sensor circuit output indicative of a property of a battery module of the battery pack.

(A7) In the multipoint communication system denoted as (A6), the node sensor circuit of each of the plurality of nodes may be electrically coupled to a respective battery module of the battery pack.

(A8) In any one of the multipoint communication system denoted as (A1) through (A7), the distributed antenna may be physically routed proximate to a wiring harness of the battery pack.

(A9) Any one of the multipoint communication system denoted as (A1) through (A8) may further include a plurality of distributed antennas, where (1) the RF gateway includes a plurality of base transceiver circuits and (2) each of the plurality of distributed antennas is uniquely electrically coupled to one of the plurality of the base transceiver circuits.

(A10) In the multipoint communication system denoted as (A9), the plurality of distributed antennas may be at least partially disposed within the battery pack.

(A11) In any one of the multipoint communication system denoted as (A1) through (A10), the distributed antenna may include a coaxial cable having a plurality of gaps in an outer conductor of the coaxial cable.

(A12) In the multipoint communication system denoted as (A11), each of the plurality of nodes further may include a node antenna physically located proximate to a respective one of the plurality of gaps.

(A13) In the multipoint communication system denoted as (A12), the coaxial cable may be flexible.

(A14) In any one of the multipoint communication systems denoted as (A1) through (A10), the distributed antenna may include a coaxial cable having an outer conductor with a nominal thickness, the coaxial cable having a plurality of thinned regions where a thickness of the outer conductor is less than the nominal thickness.

(A15) In the multipoint communication system denoted as (A14), each of the plurality of nodes further may include a node antenna physically located proximate to a respective one of the plurality of thinned regions.

(A16) In the multipoint communication system denoted as (A15), the coaxial cable may be flexible.

(A17) In any one of the multipoint communication systems denoted as (A1) through (A10), the distributed antenna may include a waveguide formed from a plurality of electrically conductive surfaces, and at least one of the plurality of electrically conductive surfaces may form a part of a battery of the battery pack.

(A18) In the multipoint communication system denoted as (A17), the RF gateway may further include a base station antenna for exciting the waveguide and receiving transmissions from the waveguide.

(A19) In any one of the multipoint communication systems denoted as (A1) through (A18), the RF gateway and the plurality of nodes may be configured as a wireless personal area network.

(A20) In the multipoint communication system denoted as (A19), the wireless personal area network may be based on one of Bluetooth Low Energy and ZigBee.

(A21) In the multipoint communication system denoted as (A20), the wireless personal area network may be based on Bluetooth Low Energy and may be configured to use a Battery Service profile.

(B1) A method for managing a battery pack may include (1) acquiring, at each of a plurality of nodes, battery information, (2) wirelessly transmitting, at each of the plurality of nodes, a first wireless communication containing the battery information to a distributed antenna at least partially disposed within the battery pack, (3) converting the first wireless communication into a first electrical communication via the distributed antenna, and (4) electrically receiving the first electrical communication from the radiating transmission line at a radio frequency (RF) gateway.

(B2) The method denoted as (B1) may further include (1) electrically transmitting a second electrical communication from the RF gateway to the distributed antenna, (2) converting the second electrical communication into a second wireless communication via the distributed antenna, and (3) wirelessly receiving the second wireless communication at each of the plurality of nodes.

(B3) The method denoted as (B2) may further include controlling each of the plurality of nodes according to a content of the second wireless communication.

(B4) In any one of the methods denoted as (B1) through (B3), the distributed antenna may be physically routed proximate to a wiring harness of the battery pack.

(B5) In any one of the methods denoted as (B1) through (B4), the distributed antenna may include a coaxial cable having a plurality of gaps in an outer conductor of the coaxial cable.

(B6) In the method denoted as (B5) the step of wirelessly transmitting may include wirelessly transmitting the battery information from each of the plurality of nodes to the plurality of gaps.

(B7) In any one of the methods denoted as (B2) through (B6), the step of wirelessly transmitting may further include wirelessly transmitting the battery information via a protocol used for a wireless personal area network and the step of electrically receiving may include electrically receiving the battery information via the protocol used for the wireless personal area network.

(B8) In the method denoted as (B7), the step of electrically transmitting may include electrically transmitting via the protocol used for the wireless personal area network, and the step of wirelessly receiving may include wirelessly receiving via the protocol used for the wireless personal area network.

(B9) In any one of the methods denoted as (B7) and (B8), the wireless personal area network is based on one of Bluetooth Low Energy and ZigBee.

(C1) An energy storage system may include a battery pack, a controller, and a multipoint communication system. The multipoint communication system may include (1) a distributed antenna at least partially disposed within the battery pack, (2) a plurality of nodes, each node wirelessly coupled to the distributed antenna and configured to acquire battery information, and a (3) radio frequency (RF) gateway electrically coupled to the distributed antenna and the controller.

(C2) In the energy storage system denoted as (C1), each of the plurality of nodes may be electrically coupled to a respective battery module of the battery pack.

(C3) In any one of the energy storage systems denoted as (C1) and (C2), each of the plurality of nodes may be configured to transmit a first wireless communication containing respective battery information to the distributed antenna, the distributed antenna may be configured to convert the first wireless communication into a first electrical communication, the RF gateway may be configured to receive the first electrical communication, and the controller may be configured to receive the first electrical communication from the RF gateway.

(C4) In the energy storage system denoted as (C3), the RF gateway may be configured to receive a second electrical communication from the controller, the RF gateway may be configured to electrically transmit the second electrical communication to the distributed antenna, the distributed antenna may be configured to convert the second electrical communication into a second wireless communication, and the plurality of nodes may be configured to receive the second wireless communication.

(C5) In any of the energy storage systems denoted as (C1) through (C4), the distributed antenna may include a coaxial cable having a plurality of gaps in an outer conductor of the coaxial cable.

(C6) In the energy storage system denoted as (C5), each of the plurality of nodes further may include a node antenna physically located proximate to a respective one of the plurality of gaps.

(C7) In any one of the energy storage systems denoted as (C1) through (C4), the distributed antenna may include a coaxial cable having an outer conductor with a nominal thickness, the coaxial cable having a plurality of thinned regions where a thickness of the outer conductor is less than the nominal thickness.

(C8) In the energy storage system denoted as (C7), each of the plurality of nodes may further include a node antenna physically located proximate to a respective one of the plurality of thinned regions.

(C9) In any one of the energy storage systems denoted as (C1) through (C4), the distributed antenna may include a waveguide formed from a plurality of electrically conductive surfaces, at least one of the plurality of electrically conductive surfaces forming a part of a battery of the battery pack.

(C10) In the energy storage system denoted as (C9), the base station may further include a base station antenna for exciting the waveguide and receiving transmissions from the waveguide.

Changes may be made in the above methods and systems without departing from the scope hereof. For example, although the multipoint communication systems are discussed above with respect to battery management systems, the multipoint communication systems could be used in other applications. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A multipoint communication system for a battery management system, comprising:
    a distributed antenna at least partially disposed within a battery pack, the distributed antenna including a coaxial cable having a plurality of gaps in an outer conductor of the coaxial cable;
    a plurality of nodes, each node wirelessly coupled to the distributed antenna and configured to acquire battery information; and
    a radio frequency (RF) gateway electrically coupled to the distributed antenna.

2. The multipoint communication system of claim 1, wherein each of the plurality of nodes is electrically coupled to a respective battery module of the battery pack.

3. The multipoint communication system of claim 1, wherein:
    each of the plurality of nodes is configured to transmit a first wireless communication containing respective battery information to the distributed antenna;
    the distributed antenna is configured to convert the first wireless communication into a first electrical communication; and
    the RF gateway is configured to receive the first electrical communication.

4. The multipoint communication system of claim 3, wherein:
    the RF gateway is configured to electrically transmit a second electrical communication to the distributed antenna;
    the distributed antenna is configured to convert the second electrical communication into a second wireless communication; and
    the plurality of nodes are configured to receive the second wireless communication.

5. The multipoint communication system of claim 1, wherein the distributed antenna is physically routed proximate to a wiring harness of the battery pack.

6. The multipoint communication system of claim 1, wherein each of the plurality of nodes further comprises a node antenna physically located proximate to a respective one of the plurality of gaps.

7. The multipoint communication system of claim 1, wherein the coaxial cable is flexible.

8. A multipoint communication system for a battery management system, comprising:
- a distributed antenna at least partially disposed within a battery pack, the distributed antenna including a coaxial cable having an outer conductor with a nominal thickness, the coaxial cable having a plurality of thinned regions where a thickness of the outer conductor is less than the nominal thickness;
- a plurality of nodes, each node wirelessly coupled to the distributed antenna and configured to acquire battery information; and
- a radio frequency (RF) gateway electrically coupled to the distributed antenna.

9. The multipoint communication system of claim 8, wherein each of the plurality of nodes is electrically coupled to a respective battery module of the battery pack.

10. The multipoint communication system of claim 8, wherein:
- each of the plurality of nodes is configured to transmit a first wireless communication containing respective battery information to the distributed antenna;
- the distributed antenna is configured to convert the first wireless communication into a first electrical communication; and
- the RF gateway is configured to receive the first electrical communication.

11. The multipoint communication system of claim 10, wherein:
- the RF gateway is configured to electrically transmit a second electrical communication to the distributed antenna;
- the distributed antenna is configured to convert the second electrical communication into a second wireless communication; and
- the plurality of nodes are configured to receive the second wireless communication.

12. The multipoint communication system of claim 1, wherein the distributed antenna is physically routed proximate to a wiring harness of the battery pack.

13. The multipoint communication system of claim 1, wherein each of the plurality of nodes further comprises a node antenna physically located proximate to a respective one of the plurality of gaps.

14. The multipoint communication system of claim 1, wherein the coaxial cable is flexible.

15. A multipoint communication system for a battery management system, comprising:
- a distributed antenna at least partially disposed within a battery pack, the distributed antenna including a waveguide formed from a plurality of electrically conductive surfaces, at least one of the plurality of electrically conductive surfaces forming a part of a battery of the battery pack;
- a plurality of nodes, each node wirelessly coupled to the distributed antenna and configured to acquire battery information; and
- a radio frequency (RF) gateway electrically coupled to the distributed antenna.

16. The multipoint communication system of claim 15, the RF gateway further comprising a base station antenna for exciting the waveguide and receiving transmissions from the waveguide.

17. The multipoint communication system of claim 15, wherein each of the plurality of nodes is electrically coupled to a respective battery module of the battery pack.

18. The multipoint communication system of claim 15, wherein:
- each of the plurality of nodes is configured to transmit a first wireless communication containing respective battery information to the distributed antenna;
- the distributed antenna is configured to convert the first wireless communication into a first electrical communication; and
- the RF gateway is configured to receive the first electrical communication.

19. The multipoint communication system of claim 18, wherein:
- the RF gateway is configured to electrically transmit a second electrical communication to the distributed antenna;
- the distributed antenna is configured to convert the second electrical communication into a second wireless communication; and
- the plurality of nodes are configured to receive the second wireless communication.

20. The multipoint communication system of any claim 15, wherein the distributed antenna is physically routed proximate to a wiring harness of the battery pack.

* * * * *